(12) United States Patent
Chen et al.

(10) Patent No.: US 6,199,186 B1
(45) Date of Patent: Mar. 6, 2001

(54) SCREENING FOR UNDETECTED ERRORS IN DATA TRANSMISSION SYSTEMS

(75) Inventors: Brian Chen, Somerville, MA (US); Carl-Erik Wilhelm Sundberg, Chatham, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/551,483

(22) Filed: Apr. 18, 2000

Related U.S. Application Data

(62) Division of application No. 09/054,677, filed on Apr. 3, 1998, now Pat. No. 6,105,158.

(51) Int. Cl.[7] .................. H03M 13/00; H03M 13/03; G06F 11/00
(52) U.S. Cl. ............. 714/755; 714/795; 714/800
(58) Field of Search .................. 714/755, 758, 714/752, 795, 759, 786, 794, 48, 52, 753, 754, 756, 784, 799, 800, 745

(56) References Cited

U.S. PATENT DOCUMENTS

| | | | |
|---|---|---|---|
| 4,742,519 | * 5/1988 | Abe et al. | 714/755 |
| 5,208,816 | * 5/1993 | Seshardi et al. | 714/795 |
| 5,355,376 | * 10/1994 | Cox et al. | 714/795 |
| 5,537,444 | * 7/1996 | Nill et al. | 375/341 |
| 5,740,187 | * 4/1998 | Tanaka | 714/755 |
| 5,812,603 | * 9/1998 | Luthi et al. | 375/287 |
| 6,105,158 | * 8/2000 | Chen et al. | 714/755 |

\* cited by examiner

*Primary Examiner*—Christine T. Tu

(57) ABSTRACT

For a transmission system in which (a) a received sequence of symbols is processed by an inner decoder followed by an outer decoder and (b) the inner decoder is capable of providing to the outer decoder more than one output sequence corresponding to the received sequence, the decoded sequence released by the outer decoder is screened for errors undetected by the outer decoder, if a predetermined criterion is satisfied.

6 Claims, 7 Drawing Sheets

SCREENING FOR UNDETECTED ERRORS IN DATA TRANSMISSION SYSTEMS

This application is a division of application Ser. No. 09/054,677, filed Apr. 3, 1998 now U.S. Pat. No. 6,105,158.

FIELD OF THE INVENTION

The present invention relates to the screening for errors in data transmission systems, in particular for errors undetected, for example, by either an error correction code, an error detection code or a combined error correction/detection code.

BACKGROUND OF THE INVENTION

Convolutional codes, error detection codes, error correction codes or combined error detection/correction codes, and the use of a Viterbi decoder as a maximum likelihood decoder for convolutional codes are well known in the art.

In the transmitter of an illustrative data transmission system, a convolutional encoder proceeds through a sequence of states as it accepts data bits and produces output that subsequently is used to define an output sequence of symbols that is transmitted over a (noisy or otherwise impaired) channel. The output sequence of symbols corresponds to a path through the trellis that describes that encoder operation.

In the receiver, a Viterbi decoder determines the output sequence of data bits that was transmitted based on the received corrupted version of the transmitted sequence of symbols and knowledge of the code used by the encoder. The output sequence corresponds to the "best path", that is, the single path through the trellis having the best so-called path metric. For the Gaussian channel, for example, the determination of the output sequence is made by correlating with the received version all possible transmitted sequences (corresponding to paths through the trellis) and then choosing, as the "maximum likelihood" sequence, the sequence where the correlation is maximum.

Also known in the art is a group of extended Viterbi algorithms referred to as the List Viterbi algorithms. Whereas the "regular" Viterbi algorithm described above identifies the single best path through the trellis, a List Viterbi algorithm identifies the L best paths, or L best candidates, through the trellis. (The case in which L=1 is the regular Viterbi algorithm.) Versions of the List Viterbi algorithms produce a rank ordered list of the L best candidate decodings corresponding to a block of convolutional coded data. See, for example, our co-pending, commonly-assigned applications, U.S. Pat. application Ser. No. 09/055,082 entitled "List Viterbi Algorithms for Continuous Data Transmission" and U.S. Pat. application Ser. No. 09/054,676 entitled "List Viterbi Algorithms for Tailbiting Convolutional Codes" filed concurrently herewith; U.S. Pat. No. 5,208,816, issued May 4, 1993 to Seshadri and Sundberg; and U.S. Pat. No. 5,537,444 issued Jul. 16, 1996 to Nill and Sundberg.

List Viterbi algorithms are particularly effective in performing error detection/correction for convolutionally encoded data. As an example, consider a system in which a block of data to be transmitted is coded by a first, so-called outer code followed by a second, so-called inner code, where the outer code is an error detecting code and the inner code is a convolutional code. In the receiver, the decoder for the inner code is the first to operate on the received signal and it releases to the outer decoder the best decoded sequence based on the Viterbi algorithm. The outer decoder performs error detection on the best decoded sequence and, if an error is detected, may use error mitigation techniques in an attempt to repair the detected error. Such techniques may only be able to repair the error approximately, however.

On the other hand, if a List Viterbi algorithm is utilized, the L best decoded sequences can be provided, thereby eliminating the need for potentially erroneous error mitigation. In particular, if an error is detected, the second best of the L decoded sequences is tried. If it too has an error, the third best is tried, and so forth until one of the L decoded sequences satisfies the error code.

Although there is always the possibility that the decoded sequence released by the outer decoder has an error that the outer decoder did not detect, the likelihood of this occurring may be somewhat increased in those systems in which a List Viterbi algorithm is used. This is due in part to the fact that the sequence that satisfies the outer decoder may not be the first best of the L sequences identified by the List Viterbi algorithm. That is, although this sequence may satisfy the outer decoder, the List Viterbi decoder had determined that it was not the best sequence corresponding to the sequence that was transmitted and, therefore, the sequence may in fact have errors that escaped detection by the outer decoder.

Undetected errors in a sequence released by the outer decoder may be problematic in, for example, digital audio data transmission systems, such as Digital Audio Broadcasting systems. In such systems, if the outer decoder, for example, a Cyclic Redundancy Check ("CRC") decoder, detects no error in the sequence provided by the Viterbi decoder, it releases the CRC-decoded sequence to an audio decoder and subsequently an analog audio signal corresponding to the released sequence is generated. On the other hand, if the CRC decoder detects an error in the sequence provided to it, an error flag is raised, thereby initiating audio decoder error mitigation routines. The error mitigation routines may provide, for example, for the substitution by an error mitigation signal for the audio signal that would correspond to the sequence in error. However, if a CRC error is not detected, no error flag is raised and the CRC-decoded sequence containing the error is released to the audio decoder, possibly causing significant errors in the resulting analog audio signal.

Increasing the number of error code bits for a block of information may alleviate this problem but results in a decreased information bit rate, given that the channel bandwidth is fixed. Thus, for transmission systems that utilize a List Viterbi algorithm, it would be advantageous to be able to further examine, or "screen", the sequences that were found to satisfy an error code but which may contain an error undetected by the outer decoder.

SUMMARY OF THE INVENTION

In accordance with the invention, for a transmission system in which (a) a received sequence of symbols is processed by an inner decoder followed by an outer decoder and (b) the inner decoder is capable of providing to the outer decoder more than one output sequence corresponding to the received sequence, the decoded sequence released by the outer decoder is screened, if a predetermined criterion is satisfied, for errors undetected by the outer decoder. The predetermined criterion may, for example, be an indication of the reliability of the decoded sequence or may be the fact that the inner decoder was requested to release to the outer decoder more than one output sequence. The inner decoder may utilize a List Viterbi algorithm; the outer decoder may be an error detection decoder such as the Cyclic Redundancy Check decoder, an error correction decoder or a combined error detection/correction decoder.

For audio data transmission systems, one way in which the invention may be implemented is by generating an error indicator if the decoded sequence released by the outer decoder is deemed to contain an error—for example, if the discrepancy between an error mitigation signal and the audio signal corresponding to the decoded sequence is greater than a predetermined threshold value.

In preferred embodiments, upon the generation of the error indicator, the audio decoder substitutes the error mitigation signal for the signal corresponding to the decoded sequence. To avoid the false use of the error mitigation signal, the discrepancy between an error mitigation signal and the audio signal corresponding to the decoded sequence should be considerable. The predetermined threshold value (or other criterion used to determine whether the decoded sequence contains an error) may be experimentally determined depending on such factors as, for example, channel and source characteristics. Furthermore, to avoid undue increased complexity in the receiver, screening is performed only under certain conditions. The screening may, for example, be performed only if the decoded sequence released by the outer decoder is not the first best candidate sequence included in the list of L best candidate sequences identified by List Viterbi decoding performed by the inner decoder (i.e., L≧2).

DETAILED DESCRIPTION

As will be described in greater detail below, the principles of the present invention have been found to be particularly advantageous for digital audio transmission systems with concatenated cyclic redundancy check and convolutional codes. As such, the invention will be described at certain points in this context although it should be understood that the invention may be applied to many other types of digital communications systems in which Viterbi decoding is utilized. Indeed, it should be particularly noted that the use of cyclic redundancy check codes is purely optional and is not required for the invention.

Figures 1, 2, 3:
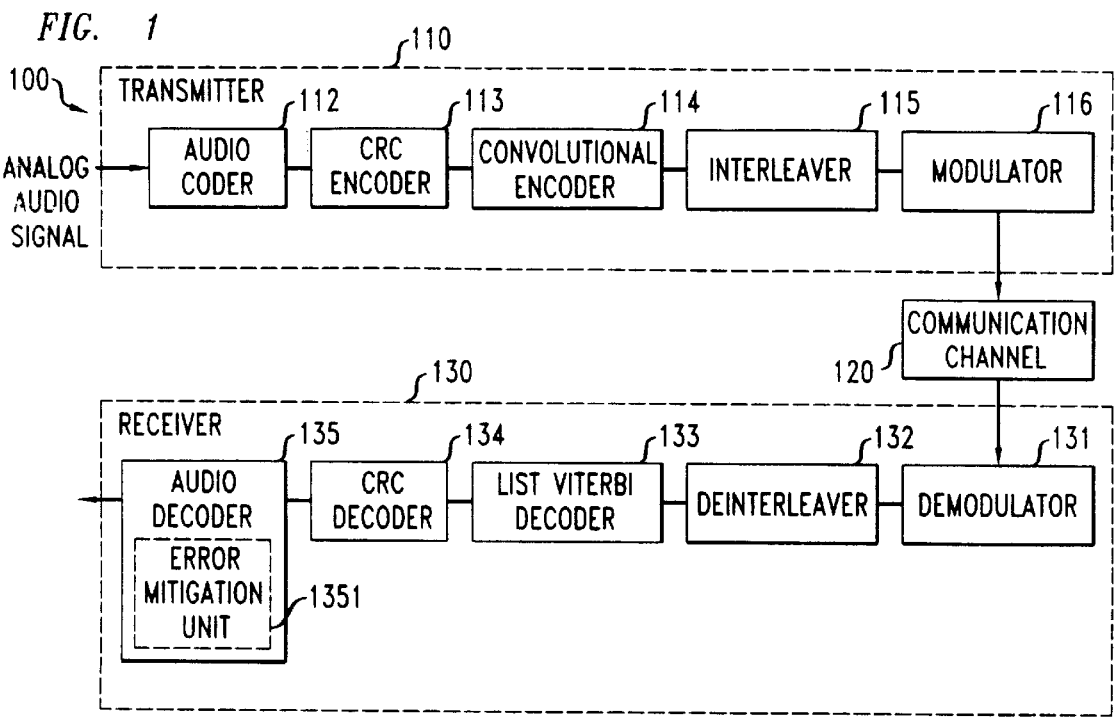
FIG. 1 shows a block diagram of a digital communication system in which the present invention is illustratively implemented.
FIG. 2 shows an illustrative trellis diagram for a 4-state encoder.
FIG. 3 shows a portion of the trellis corresponding to the trellis diagram of FIG. 2.

FIG. 1 is a simplified block diagram of a system 100 in which the present invention is illustratively implemented. System 100 includes transmitter 110, communications channel 120, and receiver 130. Transmitter 110 includes an audio coder 112 which generates frames—for example, perceptual audio coder (PAC) frame—of digital data bits from a received analog audio signal. Block encoder, shown here illustratively as Cyclic Redundancy Check ("CRC") encoder 113, appends CRC bits to a selected number of frames or portions of one or more frames thereby generating CRC frames, or blocks. CRC blocks are applied to convolutional encoder 114 to encode CRC blocks into a sequence of symbols. The symbols from convolutional encoder 114 are interleaved in an interleaver 115 of conventional design and then applied to modulator 116. Modulator 116 generates a channel signal for transmission over communications channel 120 using standard modulation techniques. In general, communications channel 120 will exhibit noise, distortion and other impairments.

Receiver 130 includes demodulator 131 which performs standard demodulation in a manner complementary to the modulation provided by modulator 116 to recover interleaved symbols. The symbols are deinterleaved in deinterleaver 132 and the resulting sequence of symbols is applied to a Viterbi decoder that executes a List Viterbi algorithm, List Viterbi decoder 133. List Viterbi decoder 133, which embodies the principles of the present invention, as described below, provides a rank-ordered list of the L best candidate sequences for the sequence of symbols actually transmitted. In providing this list, List Viterbi decoder 133 may employ either hard or soft decision schemes, in accordance with well-known techniques and, in particular, releases the first best candidate sequence to CRC decoder 134. CRC decoder 134 performs error detection on the candidate sequence and, if no error is detected, releases a digital data bit stream to audio decoder 135 (which includes error mitigation unit 1351). Audio decoder 135 uses the digital data bit stream to generate an analog audio signal that is the most likely estimate of the original audio signal.

If, however, an error is detected by CRC decoder 134, the second best candidate sequence of the identified L best candidate sequences is released to CRC decoder 134. If an error in this sequence is detected, the third best candidate sequence is released, and so forth. This process continues with subsequent best candidate sequences until the one sequence (if any) that satisfies the CRC is identified.

If errors are detected in all of the candidate sequences released by List Viterbi decoder 133, CRC decoder 134 releases an error flag. Error mitigation unit 1351 of audio decoder 135 mitigates the effect of a potential channel error in a well known manner (for example, by interpolation between surrounding PAC frames). As will be appreciated by those skilled in the art, transmitter 110 and receiver 130 may perform other functions and include additional elements not shown in FIG. 1 or may exclude certain elements shown in the FIGURE.

As is well known in the art, a convolutional encoder may be viewed as a finite-state machine that operates serially on a sequence of information bits. The state of the encoder at any point in time is defined as the content of the encoder memory.

A trellis diagram such as that shown in FIG. 2 for an illustrative memory 2,4-state encoder, defines, for each encoder state, to which next state or states the encoder is allowed to transition. The four states of the encoder are denoted by nodes labeled 0 through 3. The two vertical lines of points in FIG. 2 respectively represent the possible current and next encoder states. The lines, or branches, connecting the various pairs of states indicate the allowed state transitions. For example, the encoder can transition from current state 0 to either next state 0 or 1 but not to states 2 or 3. The encoder transitions from one state to another in response to input information bits, the transition being indicated by a branch in the trellis diagram.

Multiple concatenated repetitions of an encoder's trellis diagram form a trellis indicating a sequence of encoder state transitions over time. For example, FIG. 3 shows a portion of the trellis corresponding to the trellis diagram of FIG. 2. In particular, FIG. 3 represents four successive state transitions of the encoder over a period of five intervals indicated as j through j+4. A specific input sequence causes the encoder to transition through a sequence of states corresponding to a sequence of interconnected branches, called a path, through the trellis. That is, given a particular encoder starting state, any particular stream of information bits to be convolutionally coded will result in a unique path through the trellis. As the encoder transitions through the sequence of states, its output is used to define a corresponding sequence of output symbols.

At this point, for pedagogical reasons, the decoding process in terms of the regular Viterbi algorithm will first be discussed, followed by a description of the List Viterbi decoding process.

Figure 4:
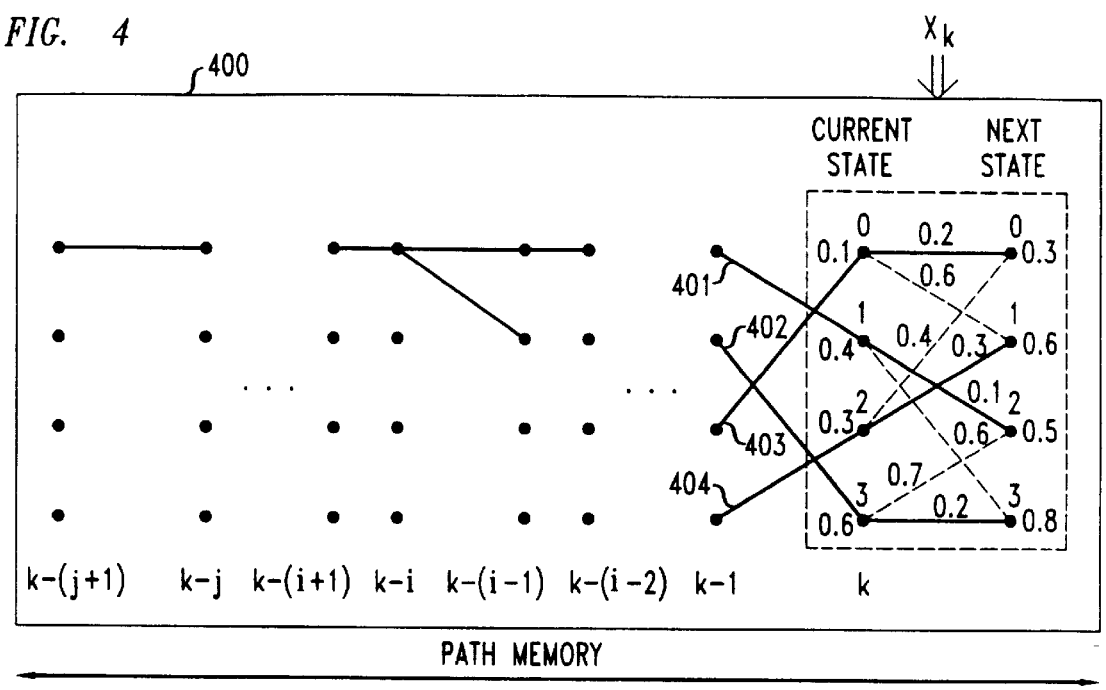
FIG. 4 provides a functional view, at a particular point in time, of a Viterbi decoder.

Based on the received sequence of channel-corrupted symbols and knowledge of the convolutional code used by the encoder, the Viterbi decoder determines the path with the best path metric. For the Gaussian channel, for example, the path metric reflects the correlation between the received sequence of channel-corrupted symbols and the possible transmitted sequence corresponding to the path associated with that path metric. Thus, the path with the best metric corresponds to the most likely sequence of symbols that was transmitted, i.e., the most likely path of the encoder through the trellis. For the general case, e.g., for non-Gaussian channels or for decoding criterion other than maximum likelihood, the path metric is not necessarily a correlation metric but may, for example, be one of the well-known metrics such as the log likelihood metric, the log aposteriori metric, or the Hamming metric. The Viterbi algorithms, including the List Viterbi algorithms (for blockwise or continuous transmission), work for any path metric, whether or not the path metric corresponds to maximum likelihood decoding. The Viterbi decoder operates by determining the path with the best metric leading into each state of the code at any point in time. These are the aforementioned surviving paths. The operation of a Viterbi decoder for the 4-state convolutional code shown in FIG. 2 is illustrated in FIG. 4. This illustration includes a representation of the surviving paths through the trellis. Only surviving paths are considered as candidate paths for the best path through the trellis.

As shown in FIG. 4, at interval k, Viterbi decoder 400 receives channel-corrupted symbol $X_k$ and proceeds to extend the four current surviving paths (labeled 401 through 404) through the trellis and to update their path metrics. The current path metrics for surviving paths 401 through 404 are 0.4, 0.6, 0.1 and 0.3, respectively. As also shown, so-called branch metrics are computed for each branch of the trellis in a well known manner. For each next state of the code, the decoder compares the path metrics of the two extended surviving paths entering that state. In the case of next state 0, those paths metrics are (0.1+0.2=) 0.3 and (0.3+0.4=) 0.7. The path with the best path metric, in this case the extension of path 403 through next state 0, is retained as a new surviving path. The other extended paths that are retained as new surviving paths are indicated in FIG. 4 by solid lines, these having path metrics of (0.3+0.3=) 0.6; (0.4+0.1=) 0.5; and (0.6+0.2=) 0.8, respectively. The extended paths that are "pruned" or discarded have their last constituent branch indicated by dashed lines.

All surviving paths tend to lead back to a unique node in the trellis and hence to an unique symbol. In other words, it is highly likely that, looking backwards in time, the surviving paths will merge into the same predecessor path. For example, all surviving paths in FIG. 4 illustratively merge at interval k-i. The decoding depth is the depth at which it is highly likely that the merging of surviving paths occurs and is fixed for a given practical implementation. The example of FIG. 4 has a decoding depth of "i".

The term path memory as used herein is the length of the sequence of symbols which the decoder remembers when making a decision as to the value of an earlier received symbol(s)—"j+1" in the example illustrated in FIG. 4. Although path memory may be equal to the decoding depth, it typically is greater than the decoding depth to provide for buffering. Ideally the buffering will improve the accuracy of the decoding decisions by providing time such that the decoder may recover from any error in progress before releasing a decoding decision. As an example, the buffering in FIG. 4 comprises the trellis branches from interval k-i to interval k-(J+1).

Figure 5:
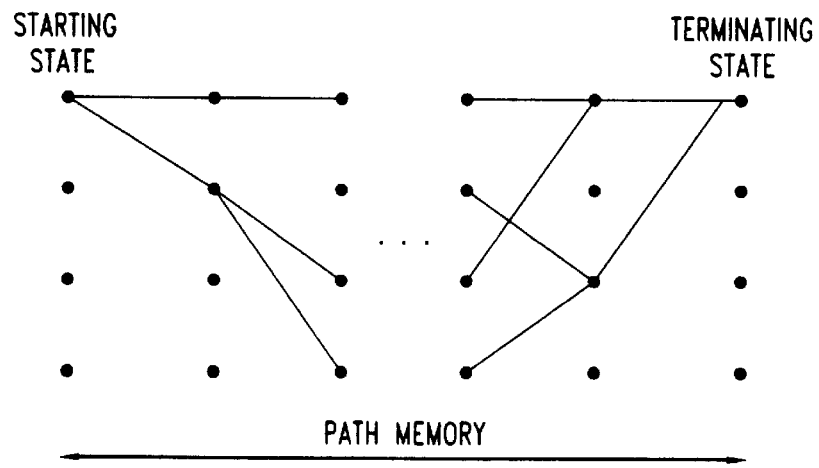
FIG. 5 shows a representation of a typical trellis illustratively used in Viterbi decoding.

There are several ways in which decisions may be made by a Viterbi decoder. If the Viterbi decoder knows the number of transmitted symbols and the encoder starting state, the decoder may withhold making any decisions until all symbols are processed. At that time, the decoder will have completed its forward processing through the trellis and will be ready to make a decision as to the best path. Only paths which begin with the known staring state can be regarded as surviving paths and the surviving path having the best path metric is typically selected as the best path. If the decoder further knows the identity of the encoder termination state (e.g., a tail was appended to the data), the surviving path with the best path metric that enters that known termination state is determined to be the best path. The decoder then releases the sequence of symbols in the best path as its best estimate of the transmitted symbols. In this case, path memory is the length of the paths extending from the starting to the terminating states. This scenario is illustrated in FIG. 5, in which both the starting and terminating states are state 0.

Continuous Viterbi decoding operates on a symbol-by-symbol basis and is used, for example, when the sequence of symbols received by the decoder is very long. Path memory is said to be truncated to a specified length and is referred to as a decoding window. (The length of the decoding window is generally dependent on such factors as the channel signal-to-noise ratio ("SNR") and the so-called code rate and code memory.) At each interval, as the decoder receives a symbol, new surviving paths having updated path metrics are identified. One of the surviving paths is identified as the best path. By tracing back along the best path within the decoding window, the decoder makes a decision about the value of an earlier received symbol—namely, the value of the symbol associated with the first branch on the best path within the decoding window. The decoding window then slides forward one interval and the process is repeated. Thus, using the example illustrated in FIG. 4, at interval k, the decoder makes a decision as to the value of a symbol received j+1 intervals ago. Decoding decisions made in this manner typically are satisfactory if the decoding window length is approximately five to ten times the so-called constraint length of the convolutional code.

Further details of standard Viterbi decoding, which is well known in the art, are presented in Clark and Cain, Error-Correction Coding for Digital Communications, particularly Ch. 6, (1981).

In some circumstances, it may be advantageous to identify not only the single best path through a trellis but also a certain number, L, of candidate best (typically in terms of path metrics) paths. A List Viterbi algorithm, or LVA, produces a rank ordered list of the L best candidates corresponding to a block of convolutionally coded data. That is, an LVA finds the L best output sequences of a certain length, e.g., the length of the corresponding data block. See, for example, N. Seshadri and C-E. Sundberg, "List Viterbi Decoding Algorithms with Applications," *IEEE Transactions on Communications*, vol. 42, pp. 311–23, February/March/April 1994 and C. Nill and C-E. W. Sundberg, "List and Soft Symbol Output Viterbi Algorithms: Extensions and Comparisons," *IEEE Transactions on Communications*, vol. 43, February/March/April 1995.

List Viterbi algorithms known in the art are executed with a path memory extending from an LVA starting state to an LVA terminating state and require that the decoder know the identities of the LVA starting and LVA terminating states. In the prior art, to find the L best candidates corresponding to a data block, the LVA starting state is the block starting state, i.e., the state of the encoder when the block encoding commenced, and the LVA terminating state is the block terminating state, i.e., the encoder state when the block encoding terminated. Although a block starting state known to the decoder is easy to achieve, a known block terminating state is achieved in the prior art by the blockwise termination of data blocks with a tail.

In contrast, the invention disclosed in our co-pending, commonly assigned application titled "List Viterbi Algorithms for Continuous Data Transmission", application Ser. No. 09/055,082, provides for continuous LVA decoding, i.e., decoding a sequence of data blocks using an LVA without having had to append a tail to the data in each block. The problem of establishing a known LVA terminating state—resolved in the prior art by the fact that the LVA terminating state is the block terminating state which is known to the decoder by appending a tail—is addressed by utilizing Viterbi decoding to estimate the LVA terminating (and optionally the starting) state for each block. Using the estimated LVA (starting and) terminating state(s), an LVA is then executed. And, according to the principles of that invention, path memory is extended over a longer span of symbols than that which is typically required for continuous Viterbi decoding of the information blocks.

Figure 6:
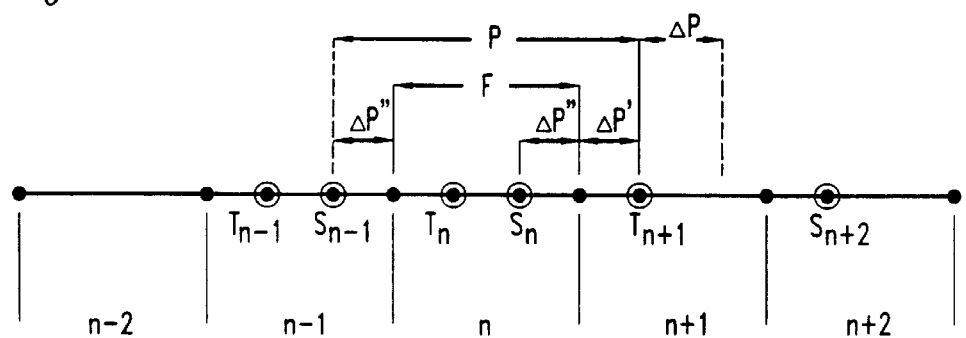
FIGS. 6–7 are diagrams helpful in explaining the principles of the invention disclosed in a co-pending application.

This is illustrated in FIG. 6, which is a diagram helpful in explaining the principles of the invention disclosed in application Ser. No. 09/055,082. It is assumed that a sequence of blocks of symbols were transmitted in a continuous mode, by which we mean that they have not been blockwise terminated with a tail. FIG. 6 reflects a steady-state situation in which the decoder has decoded the prior block(s) after a start-up phase typically initated in a known state (easily achieved using prior art techniques).

In FIG. 6, five blocks (n–2, n–1, n, n+1, and n+2) are shown and LVA decoding is illustratively to be performed on block n. Block n has a length of F symbols and the path memory used in LVA decoding has a length of P symbols and extends from LVA starting state, $S_{n-1}$, to LVA terminating state, $T_{n+1}$. In order for the initial, regular Viterbi decoding to estimate the LVA starting and terminating states, a path memory of ΔP would suffice. However, the subsequent LVA decoding requires knowledge of the best paths between those states and to that end, the regular Viterbi decoding needs to operate with a path memory of P+ΔP. Illustratively, for some digital audio applications, ΔP<<F, a conservative estimate for ΔP being approximately 10 code constraint lengths.

The LVA terminating state may in fact be the block terminating state, that is, the state associated with the end of block n. However, in order to ensure very accurate operation of the LVA decoding, the LVA terminating state is preferably the state of the encoder when encoding a symbol occuring beyond the current block. Indeed, as seen in the FIG., LVA terminating state $T_{n+1}$ occurs beyond block n by ΔP' symbols. The LVA starting state may in fact be the block starting state, that is, the state associated with the start of block n. However, the LVA starting state also preferably occurs outside of the current block, again to enhance the accuracy of the List Viterbi decoding. Indeed, as seen in the FIG., LVA starting state $S_{n-1}$ occurs ahead of block n by ΔP" symbols.

The processing proceeds more particularly as follows.

(1) Starting state $S_{n-1}$ was estimated by the decoder during the decoding of block n–1 in manner to be described below.

(2) Terminating state $T_{n-1}$ is estimated by the regular Viterbi decoding by tracing back along the best path identified (ΔP'+AΔP) symbols after the end of block n.

(3) Starting state $S_n$ was estimated by the regular Viterbi decoding by tracing back along the best path identified ΔP" symbols before the end of block n. Starting state $S_n$ will be used in the LVA decoding of block n+1. Indeed, it was by this mechanism that starting state $S_{n-1}$ was estimated during the decoding of block n–1.

(4) The regular Viterbi process now having done its job, LVA decoding is performed using $S_{n-1}$ as the starting state and $T_{n+1}$ as the terminininating state, thereby identifying the L best paths (of length P) between these states.

(5) The L best paths of length P are trimmed at each end to yield the L best paths of length F extending over block n. Initially, the best one of those paths, namely the one with the best path metric, is released to CRC decoder 134 (FIG. 1). The latter, however, may determine in the course of its error code checking that the sequence of symbols lying along the released path was not the actual transmitted sequence and feeds back an error flag to the List Viterbi decoder. The latter responds by releasing the second best of the L paths and the process continues until no further error flags are received. With the actual sequence of symbols now identified to the best of the system's ability, $S_n$, which is, of course, one of the states along that path and which is needed for the LVA decoding of block n+1, can now be estimated as well. This method of estimating $S_n$ is an alternative to that described above in step (3) and, depending on the particular application, either method may be appropriate. Further, it should be noted that while CRC-checking is illustratively used to select the preferred of the L best paths, other selection mechanisms may be utilized as well.

(6) The above steps are repeated for block n+1 and each subsequent block.

The design parameters ΔP, ΔP', and ΔP" are experimentally determined. Any one or all may equal zero. It will be appreciated that this will typically result in less than optimum performance, but may be desirable in particular operating environments. Preferably, the values should be large enough such that it is likely that surviving paths will have merged in time for a state to be uniquely identified.

Figure 7:
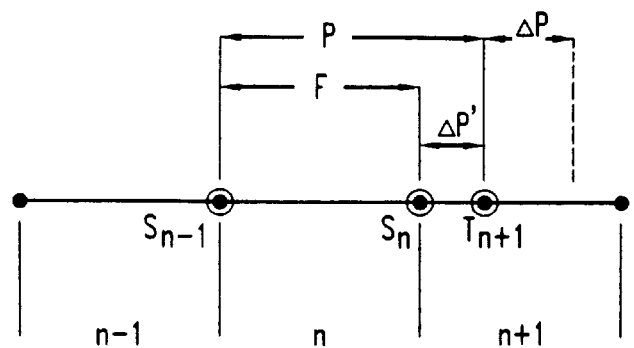

FIG. 7 shows one of the specific cases referred to above, namely where ΔP" is zero. Thus, starting state $S_{n-1}$ coincides with the end of block n−1. Path memory now extends beyond the block in one direction only—after block n.

It is noted that a certain distortion of the list of the L most likely sequences of length F extending over a block may occur if, as is the case in preferred embodiments, P is greater than F. That is, one of the L sequences of length P identified in step (4) above may differ from another sequence of length P only in the portions of the sequences that are outside of the block under process. When these sequences are trimmed in step (5) to yield corresponding sequences of length F extending only over the block, the sequences of length F are identical. Therefore, we use the term effective average list size $L_e$ to denote the average number of unique sequences of length F which correspond to the block and which are obtained when a LVA is executed to identify the L most likely sequences of length P, P>F.

Although P and F are better matched in FIG. 7 than in FIG. 6, there is a risk of error propagation in the FIG. 7 approach if an error occurs at the end of a block due in part to the fact that ΔP", which provided buffering in the FIG. 6 approach, is zero.

Although any LVA may be utilized in the above approaches, the LVA preferably used is the so-called serial LVA. The serial LVA iteratively identifies the L best sequences, or candidate paths, one at a time, beginning with the first best candidate path. Thus, the serial LVA iteratively releases the nth candidate path based on the knowledge of the previous n−1 best candidate paths. This is in contrast to the so-called parallel LVA which operates by identifying the L best candidate paths into each state of the trellis, moving forward through the trellis. It can be seen that the serial LVA has less storage and computational requirements than the parallel LVA because, unlike the parallel LVA which always produces L paths, the serial LVA identifies the nth best candidate path only as needed, for example, only where the prior released candidate paths did not satisfy the CRC.

Figure 8:
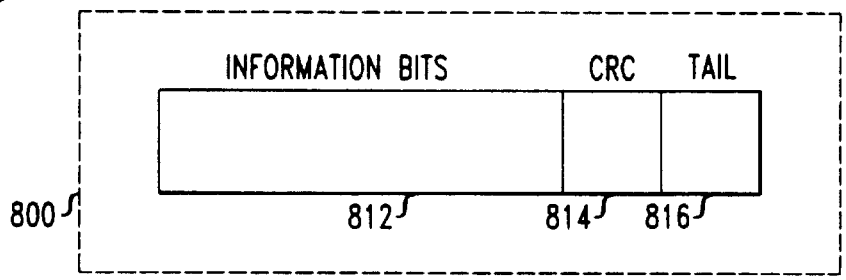
FIG. 8 shows a terminated Cyclic Redundancy Check (CRC) data block.

The advantage of eliminating the requirement of a tail is illustrated by the following examples. FIG. 8 shows an illustrative terminated CRC block 800, including information or data bits 812, CRC bits 814, and tail 816. For a so-called memory 6 code, 6 bits would be required for a tail—six bits that could otherwise be used for additional information bits. More importantly, these tail bits may otherwise be used for an expanded, more efficient CRC. With this in mind, for a block with 488 information bits, 18 CRC bits and a tail of 6 bits, overhead (measured by comparing the 6 bit tail to the 18 CRC bits) is approximately 33%. For a block with 240 information bits, 8 CRC bits and a 6-bit tail, overhead is approximately 75%. While the advantages of utilizing an LVA in applications with an error detecting/correcting code, such as the system illustrated in FIG. 1, have been discussed above in terms of identifying a sequence of symbols that satisfies the error code, it is worthwhile to note that the LVA alone may be used for error detection. For example, the difference between path metrics of two of the L candidate paths may be compared to some threshold value, perhaps, for example, a fraction of the maximum path metric value. If the difference is less than the threshold value, there is deemed to be a higher probability of error and an error flag is generated.

Figure 9:
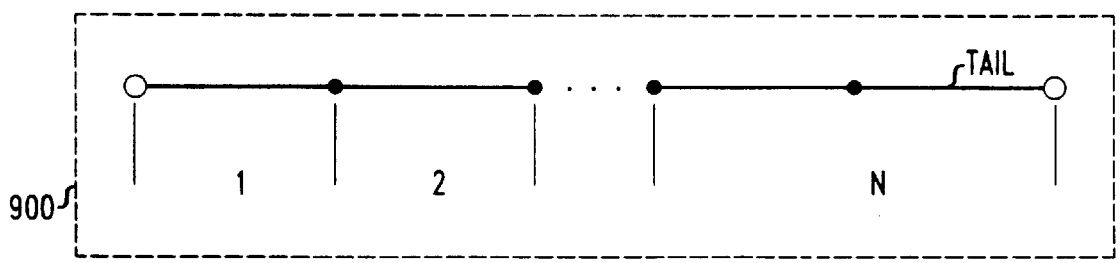
FIG. 9 illustrates a superframe which is decoded by a hybrid List Viterbi algorithm, the algorithm embodying prior art Viterbi decoding techniques as well as the principles of the invention disclosed in a co-pending application.

The invention disclosed in application Ser. No. 09/055, 082 is not limited to the particular embodiments described above. Indeed, for example, it applies to all List Viterbi algorithms that require known starting and ending states. Moreover, there may be particular implementations in which the LVA should be executed in both continuous and blockwise termination transmission modes. An example of such an implementation is illustrated in FIG. 9. In this case, a sequence of so-called superframes is transmitted. Each superframe 900 consists of N CRC blocks followed by a terminating tail. Over superframe 900, the starting state for block 1 and the terminating state for block N are known to the decoder. Thus, for blocks 1 and N, a hybrid List Viterbi algorithm may be used. This hybrid List Viterbi algorithm uses features of both the continuous LVA and the LVA for blockwise termination to take advantage in the decoding process of a known starting state or a known terminating state. The continuous LVA is executed for the remaining blocks 2, . . . , N−1. Other hybrid List Viterbi algorithms may be utilized combining features of the continuous LVA, the prior art blockwise termination LVA with a known tail, and/or the LVA used for tailbiting convolutional codes as described below.

Use of List Viterbi algorithms may significantly reduce the error flag rate in digital audio broadcasting systems from that typically experienced using the regular Viterbi algorithm but does so at the cost of increased complexity (and possibly an increased rate in CRC-undetected errors, as discussed below). The peak complexity increase with the LVA over the regular Viterbi algorithm is of the order of L for a list size of L. Note that with the serial LVA, the average increase in the number of paths that need to be explored beyond L=1 is very small due to the fact that typically more than one best path candidate is required for only a fraction of CRC blocks.

Application of an LVA to Tailbiting Convolutional Codes

As is known in the art, the convolutional encoder may be used for blockwise transmission without a known tail. This is referred to as tailbiting. Tailbiting eliminates the overhead of a tail but does so at the price of decreased performance and increased complexity. Thus, tailbiting is often used for short information blocks and is more suitable for data, as opposed to speech transmission, for example.

In tailbiting, the encoder starts and terminates the process of encoding a block of data in the same state. The decoder is aware that the encoder starting and terminating states are identical. However, the identity of that state is data-dependent and thus unknown to the decoder.

The invention disclosed in our co-pending, commonly assigned application titled "List Viterbi Algorithms for Tailbiting Convolutional Codes", application Ser. No. 09/055, 082, provides for the List Viterbi decoding of a block of data that has been encoded with a tailbiting convolutional code in a manner that takes advantage of decoder knowledge that the starting and terminating states are identical but data-dependent. In particular, a block of information is decoded using a Viterbi algorithm for tailbiting convolutional codes to identify at least one path through the trellis extending from a starting to an identical terminating state. The so-identified starting and terminating states are used in the subsequent decoding of the block with an LVA to identify an ordered list of candidate decodings corresponding to the block.

Figure 10:
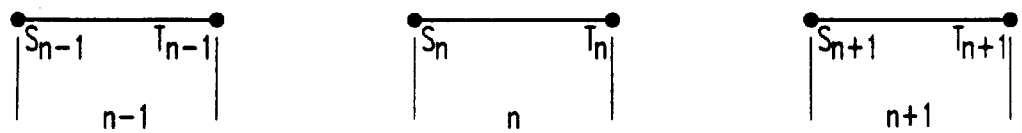
FIG. 10 shows a sequence of blocks that have been encoded using a tailbiting convolutional code.

FIG. 10 illustrates independent blocks that have been encoded using a tailbiting convolutional code, each block having identical starting and terminating states. That is, state $S_{n-1}$ is identical to state $T_{n-1}$, state $S_n$ is identical to state $T_n$, and state $S_{n+1}$ is identical to state $T_{n+1}$. There are at least two approaches to perform List Viterbi decoding of these blocks according to the invention disclosed in application Ser. No. 09/054,676: one approach utilizes the so-called optimum Viterbi algorithm for decoding tailbiting convolutional codes and the other approach utilizes the so-called suboptimum Viterbi algorithms. Techniques using these approaches are described in detail below. It should be understood that these techniques are merely illustrative and not limiting; many different variations of the techniques may be utilized.

To perform optimum maximum-likelihood decoding of a block of data as taught in the prior art, Viterbi decodings must be performed for each of the different pairs of identical starting and terminating states to find the best path through the trellis that satisfies the constraint of identical starting and terminating states. Thus, for example, for a code with $2^\mu$ states (and memory $\mu$), $2^{82}$ Viterbi decodings will be performed. Each decoding identifies a best path candidate. The $2^\mu$ candidates thus identified are compared and one is selected, typically based on path metrics, as the single best path through the trellis having identical starting and terminating states.

Figure 11:
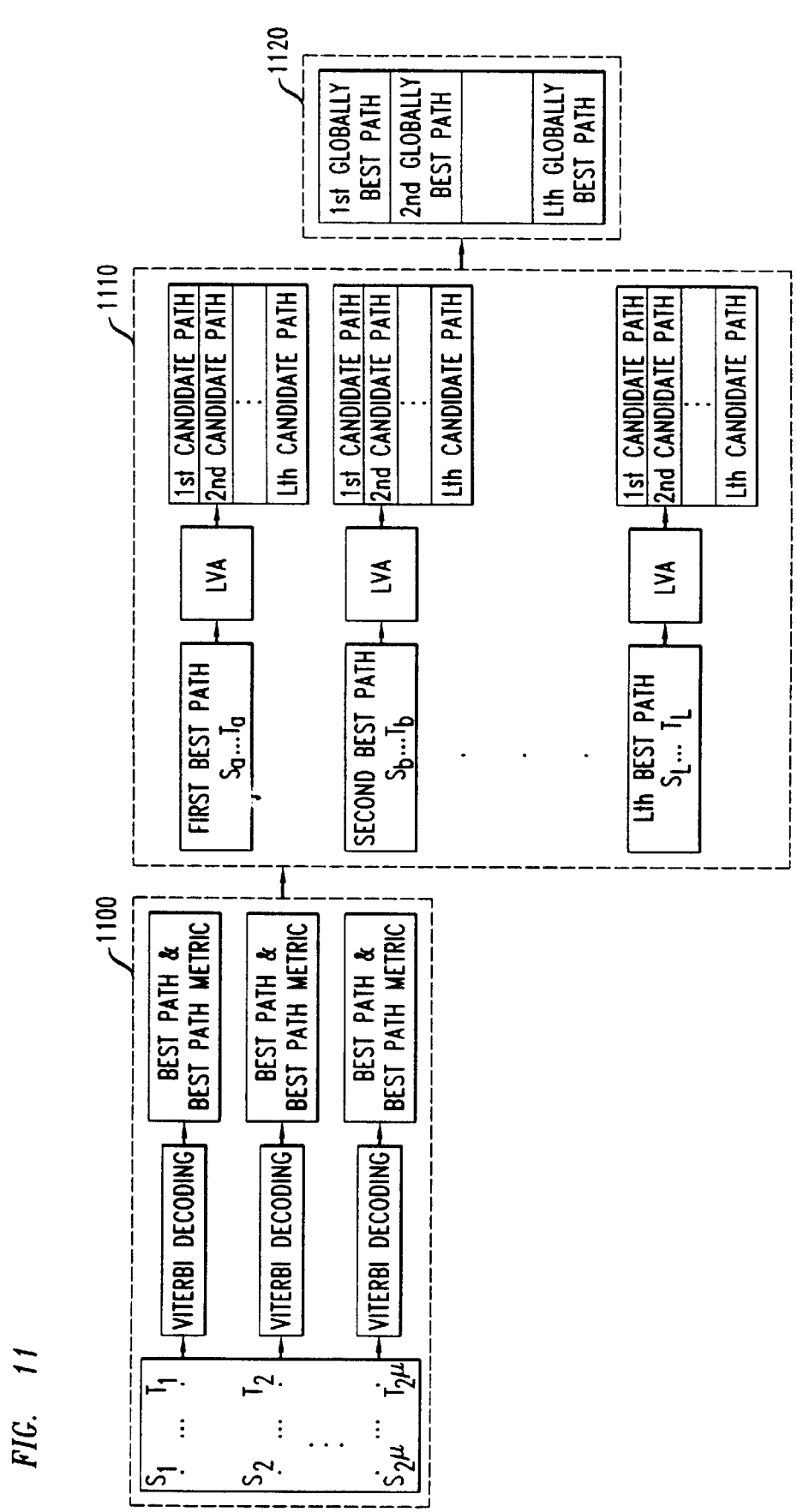
FIGS. 11–13 are diagrams helpful in explaining the List Viterbi decoding of blocks that have been encoded using a tailbiting convolutional code, according to the principles of the invention disclosed in another co-pending application.
Figure 12:
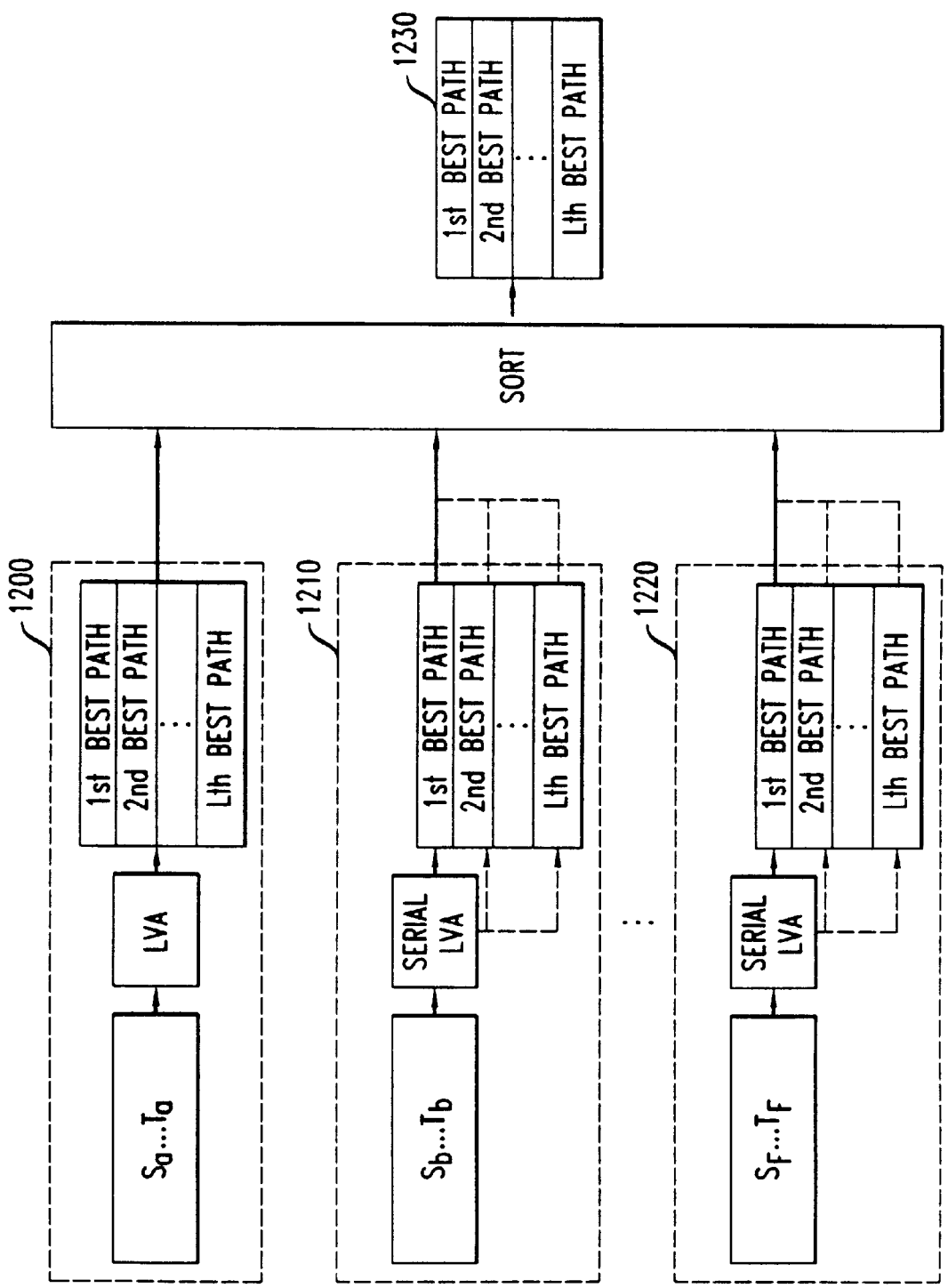

In the above-described Viterbi decodings, the path metrics (or some other criteria for comparing candidate paths) for the $2^\mu$ candidate paths have been determined. According to the principles of the invention disclosed in application Ser. No. 09/054,676, the path metrics may be used to select a number L of the $2^\mu$ pairs of identical starting and terminating states. Preferably, the selected L pairs are the pairs respectively associated with the paths having the L best path metrics. Each of the L selected pairs may subsequently be utilized by an LVA. The output of the LVA executions is consolidated to form one list of the globally L best paths. FIGS. 11–12 are helpful in explaining techniques for decoding blocks using this approach.

At step 1100 in FIG. 11, illustratively for a code with $2^\mu$ states (and memory $\mu$), $2^\mu$ decodings will be performed, each of which with a different one of the $2^\mu$ pairs of starting and terminating states, indicated by $(S_1 \ldots T_1), (S_2 \ldots T_2), \ldots, (S_{2^\mu} \ldots T_{2^\mu})$. As a result of the $2^\mu$ decodings, $2^\mu$ path metrics are generated, each path metric being associated with a path having a respective one of the $2^\mu$ pairs as starting and terminating states. Based on these path metrics, a number L of the pairs of states is selected. At step 1110, an LVA is executed L times, each execution using a respective different one of the L pairs of states indicated by $(S_a \ldots T_a), (S_b \ldots T_b), \ldots, (S_L \ldots T_L)$. Each execution of an LVA generates a list of L best candidate paths. Therefore, at this point, there are L lists, each of the L lists being comprised of L best candidate paths, for a total of $L^2$ best candidate paths. At step 1120, the L lists are consolidated to generate a single list of L best candidate paths.

A variation of this technique which may be more advantageous is to utilized a serial LVA at step 1110. The first candidate paths on the L lists in step 1110 are the best paths from the corresponding Viterbi decoding of step 1100. Thus, the best of these first candidate paths is the first globally best path of step 1120.

To find the second globally best path, the list from which the globally best path was obtained is extended by using the serial LVA to generate a second candidate path. At this point, each of the L lists contains exactly one path which is not yet on the list of the globally best paths. (The list which was extended now contains two candidate paths, the first of which is already included on the list of globally best paths at step 1120. The remaining of the L lists have only one candidate path.) The best one of the L paths not yet on the list of the globally best paths is the second globally best path of step 1120.

To find the third globally best path, the list from which the second globally best path was obtained is extended by one. At this point, as before, all L lists will have exactly one candidate path which is not yet on the list of globally best paths. The best among these L paths is the third globally best path of step 1120. This process is repeated until all globally best paths are identified.

Another technique is illustrated in FIG. 12 for the same code. At step 1200, one of the $2^\mu$ pairs of starting and terminating states is randomly selected, indicated in FIG. 12 as $(S_a \ldots T_a)$. An LVA is executed using this pair of starting and terminating states thereby generating a list of the L best candidate paths, each path having $S_a$ and $T_a$ as starting and terminating states, respectively. At step 1210, a rent pair of starting and terminating states is randomly selected, indicated as $(S_b \ldots T_b)$. The serial LVA is executed using $S_b$ and $T_b$ as the starting and terminating states, respectively. The best candidate path identified by the execution of the serial LVA is then compared (using, for example, path metrics) with the list of L best candidate paths identified in step 1200 and sorted into its place to generate a stack 1230 of the globally L best paths. The (L+1)th path is discarded. If, after the sorting process, the first candidate path identified by the serial LVA is ranked the Lth best path or is not one of the L best paths, the LVA stops execution. However if, after the sorting process, the first candidate path identified by the serial LVA is ranked above the Lth best path, a second candidate path is identified by the serial LVA and sorted into its place (if any) in the current stack of the L best paths. This process reiterates with succeeding candidate paths identified by the serial LVA until such a path is not ranked among those in stack 1230.

At this point, a third pair of starting and terminating states, different from the first and second pairs, is selected and the serial LVA is executed. The candidate path(s) identified by the serial LVA is ranked accordingly in the manner described above. This process is continued until every one of the $2^\mu$ pairs has been similarly explored. At this time, stack 1230 contains the final list of the globally L best paths.

Suboptimum decoding algorithms for tailbiting convolutional codes are less complex than the optimum decoding algorithm and are also well-known in the art. Examples are the algorithms collectively referred to as the Cox-Sundberg algorithms (hereinafter referred to as the "CS" algorithms). Briefly speaking, a CS algorithm provides for the conceptual repeating of one block of encoded data. Standard continuous Viterbi decoding is then performed on the sequence of repeated blocks, simulating the situation in which information is transmitted repeatedly in block form. By connecting repeated versions of the same block together, any decoded path through the repeated trellis will satisfy the condition of identical starting and terminating states. The decoding process is stopped by one of the well-known fixed or adaptive stopping rules. At this point, a "best" path is identified and the symbols of that path are released. Further details about CS algorithms may be found in the U.S. Pat. No. 5,355,376 issued Oct. 11, 1994 and in the article titled "An Efficient Adaptive Circular Viterbi Algorithm for Decoding Generalized Tailbiting Convolutional Codes" by Cox and Sundberg, Transactions on Vehicular Technology, Vol. 43, No. 1, February 1994.

Suboptimum decoding algorithms for tailbiting convolutional codes may also be used to determine starting and terminating states for subsequent LVA decoding.

Figure 13:
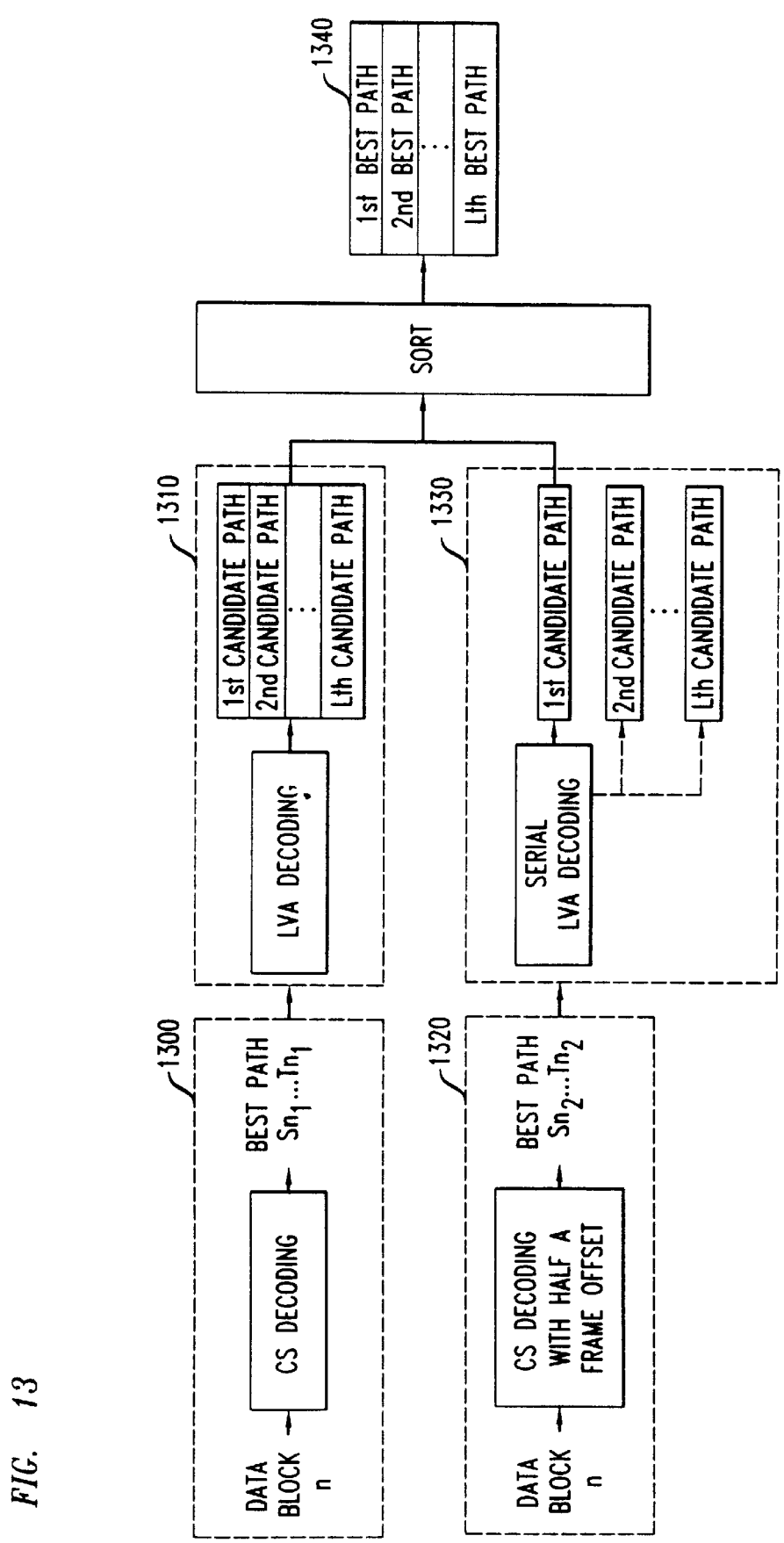

FIG. 13 is helpful in explaining such an approach. At step 1300, an CS algorithm is executed on a block of data that was encoded using a tailbiting convolutional code. A "best"

(typically based on path metrics) path and its corresponding starting and terminating states $Sn_1$ and $Tn_1$ are identified. At step 1310, the so-identified starting $Sn_1$ and terminating $Tn_1$ states are then used for LVA decoding. A list of L best candidates is thus generated.

Preferably, the CS algorithm (which, as noted above, provides for the conceptual repeating of the data block) is executed at least a second time at an offset into the data block thereby producing an offset at the output level and identifying a pair of starting and terminating states. For example, perhaps to avoid identifying best candidates with likely errors in the beginning and end of a data block, the CS algorithm is executed at step 1320 in a manner such that the output is now offset by half a block—that is, the output corresponds to the data block but is now shifted such that, for example, it begins approximately mid-block and terminates approximately at the middle of the following "repeated" data block. As a result of the second execution of the CS algorithm, a best path and its corresponding starting and terminating states, $Sn_2$ and $Tn_2$ respectively, are identified. (Alternatively, the output from the first execution of the CS algorithm may merely be shifted approximately half a block.)

At step 1330, the serial LVA is executed using $Sn_2$ and $Tn_2$. The candidate paths identified by the serial LVA at step 1310 are shifted accordingly (e.g., by the offset amount) such that they may be compared to those candidate paths listed in step 1310. Thus, the first candidate path identified by the serial LVA is shifted accordingly, compared with the L paths identified in step 1310, and sorted into its place to generate a stack 1340 of the globally L best paths. The (L+1)th path is discarded. If, after the sorting process, the first candidate path identified by the serial LVA is ranked the Lth best path or is not one of the L best paths, the LVA stops execution. However, if, after the sorting process, the first candidate path identified by the serial LVA is ranked above the Lth best path, a second candidate path is identified by the serial LVA, shifted accordingly and sorted into its place (if any) in the current stack of the L best paths. This process reiterates with succeeding candidate paths identified by the serial LVA until a path identified by the serial LVA is not ranked among those in stack 1340. At this point, stack 1340 identifies the globally L best paths.

A variation of this technique which may be more advantageous involves the utilization of a serial LVA at step 13 10 to generate candidate paths only as necessary to complete stack 1340. That is, the best of the first candidate paths in steps 1310 and 1330 is the first best path of stack 1340. To find the second best path of stack 1340, the list from which the first best path was obtained is extended by using the serial LVA. At this point, each of the lists in steps 1310 and 1330 contains one path that is not yet included in stack 1340. The better of these two paths is the second best path of stock 1340.

To find the third best path of stack 1340, the list from which the second best path was obtained is extended such that each list in steps 1310 and 1330 contains one path that is not yet included in stack 1340. The better of these two paths is the third best path of stack 1340. This process is repeated until the L best paths of stack 1340 are identifieds If one or more candidate paths of the list generated in step 1330 (shifted accordingly) is the same candidate path(s) as in the list in step 1310, the candidate path(s) is kept in only one list (e.g., the list of step 1310) and the other list is extended to contain a different path candidate.

It can be appreciated that the technique described above may be extended to, for example, executing an CS algorithm three times, each time with an offset one-third into the block or to executing an CS algorithm four times, each time with an offset one-fourth into the block, and so forth. Moreover, any suboptimum decoding algorithm for tailbiting convolutional codes other than an CS algorithm may also be utilized.

In addition, it should be understood that the discussion above is also applicable to alternative modems and to so-called "generalized tailbiting" convolutional codes. Like the tailbiting codes discussed above, generalized tailbiting codes are generated by a encoder which begins and ends in the same state. While the decoder is not aware of the identity of such state, the decoder is aware that such state is among a known subset of all encoder states.

Screening for Undetected Errors

Although use of an LVA in a digital audio system such as that illustrated in FIG. 1 enables the system to operate at lower channel SNRs, there is, however, an increased likelihood that errors in a sequence provided by the List Viterbi decoder will be undetected by the outer (CRC) decoder. This is due in part to the fact that the sequence that satisfies the outer decoder may not be the first best of the L sequences identified by the List Viterbi decoder. That is, although this sequence satisfies, for example, the CRC, the Viterbi decoder had determined that it was not the best sequence corresponding to the sequence that was transmitted and, therefore, the sequence may in fact have errors that escaped detection by the CRC decoder. Increasing the number of error code or CRC bits in an information block may alleviate this problem but results in a decreased information bit rate, given that the channel bandwidth is fixed.

In accordance with the principles of the present invention, for a transmission system in which (a) a received sequence of symbols is processed by an inner decoder followed by an outer decoder and (b) the inner decoder is capable of providing to the outer decoder more than one output sequence corresponding to the received sequence, the decoded sequence released by the outer decoder is screened, if a predetermined criterion is satisfied, for errors undetected by the outer decoder. The inner decoder may utilize a List Viterbi algorithm; the outer decoder may be an error detection decoder such as the Cyclic Redundancy Check decoder, an error correction decoder or a combined error detection/correction decoder. The predetermined criterion may, for example, be the release by the inner decoder to the outer decoder of more than one output sequence.

Figure 14:
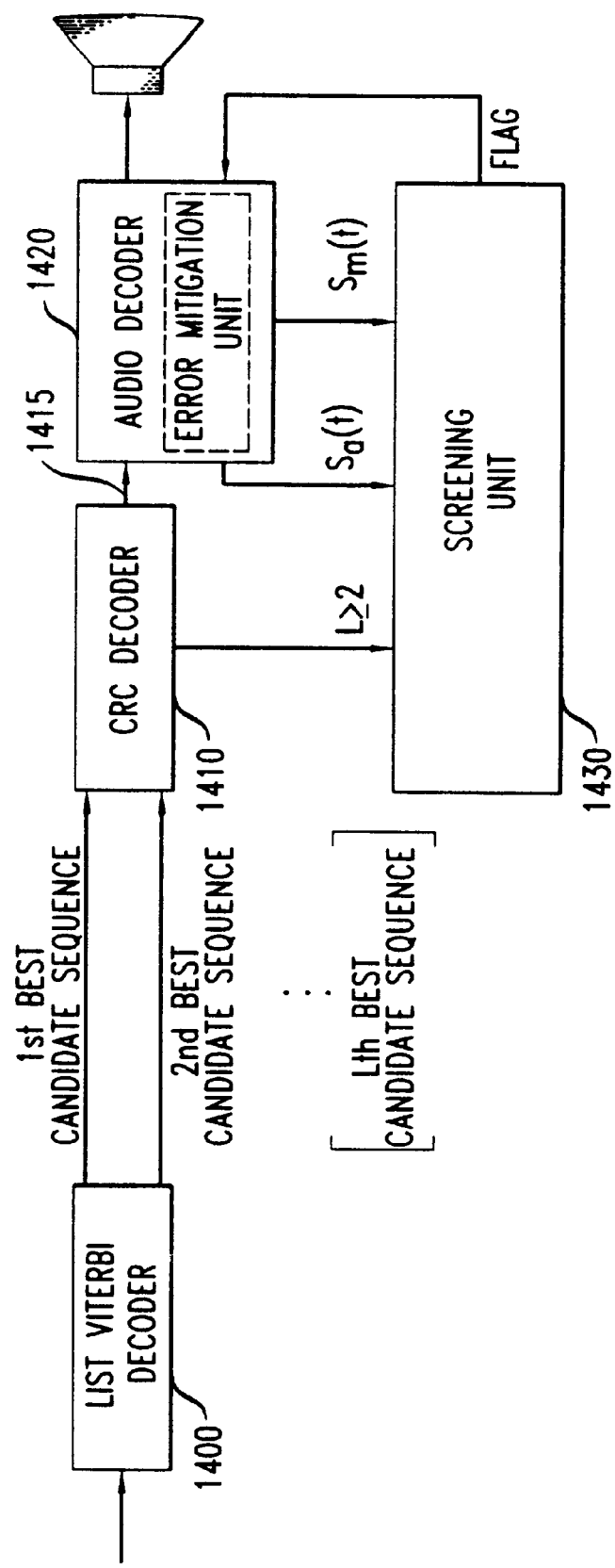
FIG. 14 shows how undetected CRC errors are screened according to the principles of the present invention.

FIG. 14 shows how the above may be applied in the illustrative audio data transmission system of FIG. 1. List Viterbi decoder 1400 receives a channel-corrupted version of a transmitted sequence of symbols and releases the first best candidate sequence to CRC decoder 1410. It is assumed that the first best candidate sequence does not satisfy the CRC but that the second best (or any one of the succeeding) candidate sequences released by List Viterbi decoder 1400 does satisfy the CRC. Typically, the CRC-decoded sequence 1415 is released to audio decoder 1420 which generates a corresponding analog audio signal.

However, according to the principles of the present invention, the CRC-decoded sequence 1415 is screened for errors that may have been undetected by CRC decoder 1410. Preferably, to avoid undue increased complexity in the receiver, this screening is performed only if a predetermined criterion is satisfied. In this case, the predetermined criterion that triggers the screening process is the fact that CRC-decoded sequence 1415 was not the first best candidate sequence identified by List Viterbi decoder 1400 (i.e., $L \geq 2$ for a given block).

The initiation of the screening for errors undetected by CRC decoder 1410 is conceptually indicated in FIG. 14 as a flag passed from CRC decoder 1410 to screening unit 1430. (The term "unit" as used in "screening unit" merely refers to the functionality of the screening process and is not intended to imply, for example, use of any specific apparatus or means.) The CRC-decoded sequence 1415 is released to audio decoder 1420 (including error mitigation unit) which generates corresponding audio signal $s_a(t)$. Audio decoder 1420 releases audio signal $s_a(t)$ and error mitigation signal $s_m(t)$ to screening unit 1430. As is known in the art, error mitigation signal $s_m(t)$ relies on a certain amount of redundancy existing between audio coder frames and may, for example, be predicted or interpolated from proximate audio coder frames over a short period of time.

Screening unit 1430 compares audio signals $s_a(t)$ and $s_m(t)$. If the discrepancy between the two signals is greater than a predetermined threshold value, screening unit 1430 forwards a flag to audio decoder 1420 indicating that error mitigation techniques should be performed. The error mitigation techniques may, for example, provide for the substitution of error mitigation signal $s_m(t)$ in place of signal $S_a(t)$.

Preferably, to avoid the false use of the error mitigation signal, the discrepancy between the error mitigation signal and the audio signal corresponding to the decoded sequence should be considerable. The predetermined threshold value (or other criterion used to determine whether the decoded sequence contains an error) may be experimentally determined depending on such factors as, for example, channel and source characteristics. There are any number of ways in which the discrepancy between $S_a(t)$ and $S_m(t)$ may be measured. One example is by using $$\int (S_a(t) - S_m(t))^2 dt > T_1$$

or $$\int \| S_a(f) - S_m(f) \|^2 df > T_2,$$

where the thresholds T1 and T2 can be applied in either the time or frequency domain. The integration interval is one audio coder frame. The threshold levels are to be experimentally established at a "high level" and should be related to statistics of the signal over a short term basis.

Alternatively, the discrepancy could, for example, be weighted. That is, the above equation may be modified to include a frequency weighting function W(f) which emphasizes certain portions of the frequency bands over others, for example:

$$\int \| W(f) \{ S_a(f) - S_m(f) \} \|^2 df > T_3,$$

and corresponding time domain weighting functions. In more advanced systems, the weighting functions and the thresholds are functions of the source-signals. (For example, in a pause in the music, clicks due to undetected errors may be most annoying.)

For clarity and brevity, the present invention has been discussed above primarily with reference to the illustrative digital audio transmission system of FIG. 1. It is to be understood, however, that this is not intended to limit the scope of this invention. For example, this invention is also applicable to a transmission system, other than an audio data transmission system, in which an error mitigation signal may be produced, including but not limited to, a video, speech or image data transmission system. Indeed, the decoder need not necessarily be a Viterbi decoder. Furthermore, screening may be performed on single, non-concatenated codes—that is, there is no requirement for an inner code followed by an outer code.

In general, according to the principles of the present invention, after the output from any type of decoder in a transmission system is initially analyzed and found to be satisfactory, the output may be screened once more for errors that may have escaped detection during the initial analysis. This screening for undetected errors may always be performed or may be triggered by a predetermined criterion being satisfied.

The foregoing Detailed Description is to be understood as being in every respect exemplary and not restrictive. Thus, for example, the principles of the invention disclosed above may be applicable to a wide range of so-called coded modulation systems (combined coding and modulation systems or trellis coded modulation systems) in which a Viterbi decoder is used. The outer code described above as a Cyclic Redundancy Code may alternatively be a Reed Solomon Code. Moreover, the diagrams herein represent conceptual views of illustrative circuitry embodying the principles of the invention. The functions of the various elements shown in the FIGS. would, in preferred embodiments, be implemented by one or more programmed processors, digital signal processing (DSP) chips, or the like.

In the claims hereof any element expressed as a means for performing a specified function is intended to encompass any way of performing that function including, for example, a) a combination of circuit elements which performs that function or b) software in any form (including, therefore, firmware, microcode or the like) combined with appropriate circuitry for executing that software to perform the function. The invention as defined by such claims resides in the fact that the finctionalities provided by the various recited means are combined and brought together in the manner called for in the claims. Applicants thus regard any means which can provide those functionalities as equivalent as those shown herein.

It will thus be appreciated that those skilled in the art will be able to devise various arrangements which, although not explicitly shown or described herein, embody the principles of the invention and thus are within its spirit and scope.

We claim:

1. A method for use in a data transmission system method comprising the steps of receiving a sequence of symbols, executing a List Viterbi algorithm to identify a set of ranked best candidate sequences corresponding to said received sequence, determining the discrepancy between an error mitigation signal and a signal corresponding to a selected one of said best candidate sequences, said error mitigation signal being capable of being substituted for said signal, and if said discrepancy is greater than a threshold value, releasing an error indicator.

2. The method of claim 1 wherein said selected one of said best candidate sequences satisfies an error detection code, an error correction code, or a combination error detection and error correction code.

3. The method of claim 2 wherein said selected one of said best candidate sequences is other than the first ranked best candidate sequence.

4. The method of claim 3 further comprising the step of if said error indicator is released, substituting said error mitigation signal for said signal corresponding to a selected one of said best candidate sequences.

5. The method of claim 4 wherein the best candidate sequence(s) ranked higher than said selected one of said best candidate sequences do not satisfy said error detection code, error correction code, or combination error detection and error correction code.

6. The method of claim 5 wherein said selected one of said best candidate sequences satisfies a Cyclic Redundancy Check code.

* * * * *